(12) United States Patent
Sapozhnikov et al.

(10) Patent No.: US 7,271,986 B2
(45) Date of Patent: Sep. 18, 2007

(54) V-SHAPE MAGNETIC FIELD SENSOR WITH ANISOTROPY INDUCED ORTHOGONAL MAGNETIC ALIGNMENT

(75) Inventors: Victor B. Sapozhnikov, Minnetonka, MN (US); Taras G. Pokhil, Arden Hills, MN (US); Olle G. Heinonen, Eden Prairie, MN (US); Janusz J. Nowak, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 733 days.

(21) Appl. No.: 10/304,663

(22) Filed: Nov. 26, 2002

(65) Prior Publication Data
US 2003/0214764 A1 Nov. 20, 2003

Related U.S. Application Data

(60) Provisional application No. 60/380,636, filed on May 15, 2002.

(51) Int. Cl.
*G11B 5/39* (2006.01)
(52) U.S. Cl. .................................. 360/324.12
(58) Field of Classification Search ........... 360/324.12, 360/313, 314, 315, 316
See application file for complete search history.

(56) References Cited

U.S. PATENT DOCUMENTS

| | | | |
|---|---|---|---|
| 6,278,592 B1 * | 8/2001 | Xue et al. | 360/324.12 |
| 6,310,751 B1 * | 10/2001 | Guo et al. | 360/315 |
| 6,449,131 B2 * | 9/2002 | Guo et al. | 360/315 |
| 6,556,388 B1 * | 4/2003 | Everitt et al. | 360/314 |
| 6,636,389 B2 * | 10/2003 | Gill | 360/314 |
| 6,801,411 B1 * | 10/2004 | Lederman et al. | 360/324.11 |
| 6,857,180 B2 * | 2/2005 | Horng et al. | 29/603.14 |
| 2001/0021087 A1 * | 9/2001 | Guo et al. | 360/315 |
| 2002/0034056 A1 | 3/2002 | Chen et al. | 360/324.12 |

* cited by examiner

*Primary Examiner*—A. J. Heinz
*Assistant Examiner*—Mark Blouin
(74) *Attorney, Agent, or Firm*—Kinney & Lange, P.A.

(57) ABSTRACT

A magnetoresistive sensor having two free layers with shape anisotropy induced magnetic alignment is disclosed. The magnetoresistive sensor includes a first ferromagnetic free layer having a first quiescent state magnetization direction. The magnetoresistive sensor also includes a second elongated free layer having a second quiescent state magnetization direction and positioned such that the first quiescent state magnetization direction is generally orthogonal to the second quiescent state magnetization direction. Further, a portion of the second ferromagnetic free layer overlaps a portion of the first ferromagnetic free layer proximal to an air bearing surface to form a v-shape. A nonmagnetic spacer layer is also positioned between the first ferromagnetic free layer and the second ferromagnetic free layer.

30 Claims, 4 Drawing Sheets

V-SHAPE MAGNETIC FIELD SENSOR WITH ANISOTROPY INDUCED ORTHOGONAL MAGNETIC ALIGNMENT

CROSS-REFERENCE TO RELATED APPLICATION(S)

This application claims priority from Provisional Application No. 60/380,636 filed May 15, 2002, for "'V'-Shape Magnetic Field Sensor With Anisotropy Induced Orthognal Magnetic Alignment" by Victor B. Sapozhnikov, Taras G. Pokhil, Olle G. Heinonen, and Janusz J. Nowak.

BACKGROUND OF THE INVENTION

The present invention relates generally to the field of magnetic data storage and retrieval systems. More particularly, the present invention relates to a magnetoresistive sensor which incorporates two free layers with generally orthogonal quiescent state magnetization directions.

In a magnetic data storage and retrieval system, a magnetic recording head typically includes a reader portion having a magnetoresistive (MR) sensor for retrieving magnetically encoded information stored on a magnetic disc. Magnetic flux from the surface of the disc causes rotation of the magnetization vector of a sensing layer of the MR sensor, which in turn causes a change in electrical resistivity of the MR sensor. The change in resistivity of the MR sensor can be detected by passing a current through the MR sensor and measuring a voltage across the MR sensor. External circuitry then converts the voltage information into an appropriate format and manipulates that information as necessary to recover the information encoded on the disc.

MR sensors have been developed that can be characterized in three general categories: (1) anisotropic magnetoresistive (AMR) sensors, (2) giant magnetoresistive (GMR) sensors, including spin valve sensors and multilayer GMR sensors, and (3) tunneling magnetoresistive (TMR) sensors.

AMR sensors generally have a single MR layer formed of a ferromagnetic material. The resistance of the MR layer varies as a function of $\cos^2\alpha$, where $\alpha$ is the angle formed between the magnetization vector of the MR layer and the direction of the sense current flowing in the MR layer.

GMR sensors have a series of alternating magnetic and nonmagnetic layers. The resistance of GMR sensors varies as a function of the spin-dependent transmission of the conduction electrons between the magnetic layers separated by the nonmagnetic layer and the accompanying spin-dependent scattering which takes place at the interface of the magnetic and nonmagnetic layers and within the magnetic layers. The resistance of a GMR sensor depends on the relative orientations of the magnetization in consecutive magnetic layers, and varies as the cosine of the angle between the magnetization vectors of consecutive magnetic layers.

TMR sensors have a configuration similar to GMR sensors, except that the magnetic layers of the sensor are separated by an insulating film thin enough to allow electron tunneling between the magnetic layers. The tunneling probability of an electron incident on the barrier from one magnetic layer depends on the character of the electron wave function and the spin of the electron relative to the magnetization direction in the other magnetic layer. As a consequence, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are anti-parallel.

For all types of MR sensors, magnetization rotation occurs in response to magnetic flux from the disc. As the recording density of magnetic discs continues to increase, the width of the tracks on the disc must decrease, which necessitates smaller and smaller MR sensors as well. As MR sensors become smaller in size, particularly for sensors with dimensions less than about 0.1 micrometers (µm), the sensors have the potential to exhibit an undesirable magnetic response to applied fields from the magnetic disc. MR sensors must be designed in such a manner that even small sensors are free from magnetic noise and provide a signal with adequate amplitude for accurate recovery of the data written on the disc. The present invention is directed to an MR sensor having two ferromagnetic free layers positioned in a v-shape for achieving such performance.

BRIEF SUMMARY OF THE INVENTION

The present invention is a magnetoresistive sensor having two free layers with shape anisotropy induced magnetic alignment. The magnetoresistive sensor includes a first ferromagnetic free layer having a first quiescent state magnetization direction. The magnetoresistive sensor also includes a second elongated free layer having a second quiescent state magnetization direction and positioned such that the first quiescent state magnetization direction is generally orthogonal to the second quiescent state magnetization direction. Further, a portion of the second ferromagnetic free layer overlaps a portion of the first ferromagnetic free layer proximal to an air bearing surface to form a v-shape. A nonmagnetic spacer layer is also positioned between the first ferromagnetic free layer and the second ferromagnetic free layer.

DETAILED DESCRIPTION

Figure 1:
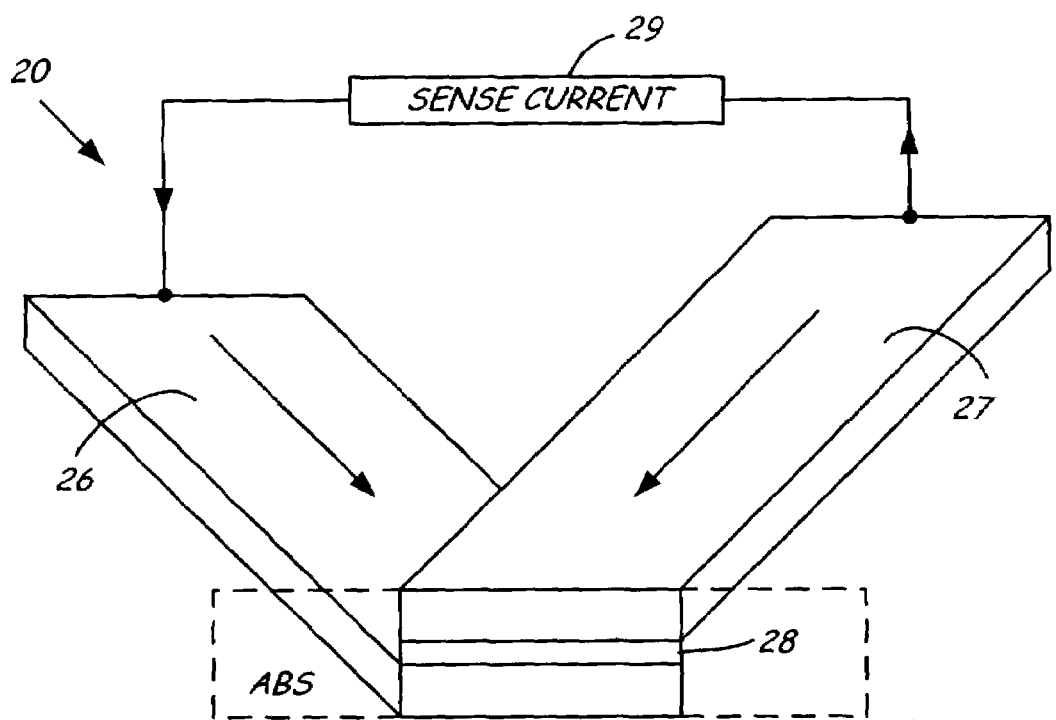
FIG. 1 shows an MR sensor according to a first embodiment of the present invention.

FIG. 1 shows an MR sensor 20 according to a first embodiment of the present invention. MR sensor 20 includes first elongated free layer 26, second elongated free layer 27, and spacer layer 28. Spacer layer 28 is positioned between first free layer 26 and second free layer 27 and covers the area between the overlapping portions of free layers 26 and 27. Spacer layer 28 can be either a tunnel barrier (to form a TMR sensor) or a conducting spacer (to form a current perpendicular-to-plane GMR sensor). First free layer 26 and second free layer 27 are situated at an angle with respect to each other. Also, each of first free layer 26 and second free layer 27 form an angle with respect to the air-bearing surface (ABS). The magnetization directions of free layers 26 and 27 are denoted by the arrows on each of the free layers.

First free layer 26 and second free layer 27 have shape anisotropy induced magnetization directions. That is, the easy axis of magnetization of first free layer 26 and second free layer 27 in a quiescent state points in a direction based on the crystal structure of the material. First free layer 26 is positioned at an angle with respect to second free layer 27 to form a v-shape such that the magnetization directions of the free layers are generally orthogonal with respect to each other. Magnetic alignment between first free layer 26 and second free layer 27 is modifiable by adjusting the shape of the free layers and by adjusting the angle between the free layers. These modifications can be performed as the particular specifications of MR sensor 20 and the magnetoresistive read/write head dictate. Because first free layer 26 and second free layer 27 use shape anisotropy to achieve orthogonal magnetization in the free layers, permanent magnet biasing is not required as in prior art designs. This allows for a decrease in sensor size, which results in an increase in track density. Furthermore, no antiferromagnetic pinning layer is used in MR sensor 20, as both magnetic layers in MR sensor 20 are free layers. Thus, the stack thickness is decreased, which results in a further increase in linear density in MR sensor 20 than in prior art designs. The lack of an antiferromagnetic pinning layer also improves the conduction of heat away from MR sensor 20 at the ABS, thus improving thermal reliability of MR sensor 20. Finally, both free layers respond to an external magnetic field, thus increasing the sensitivity of the read head compared to conventional current-in-plane spin valves or tunneling heads, in which only one layer is free to respond to an external magnetic field.

In operation, MR sensor 20 flies over the surface of a rotating magnetic disc as a portion of a magnetoresistive read/write head. As MR sensor 20 passes over the disc, flux having varying magnetic field directions is emanated from the disc, representing different states of data that are written to the disc. This is known as bit flux. As the ABS of MR sensor 20 confronts flux emanating from the disc, the angle of magnetization between first free layer 26 and second free layer 27 changes depending on the direction of the magnetic field emanating from the disc (that is, depending on the state of data at the ABS of MR sensor 20). When the angle of magnetization between the free layers changes, the resistance across the sensor also changes. Sense current 29 is applied between first free layer 26 and second free layer 27 to detect this change in resistance with the changing magnetic field at the ABS.

Figure 2:
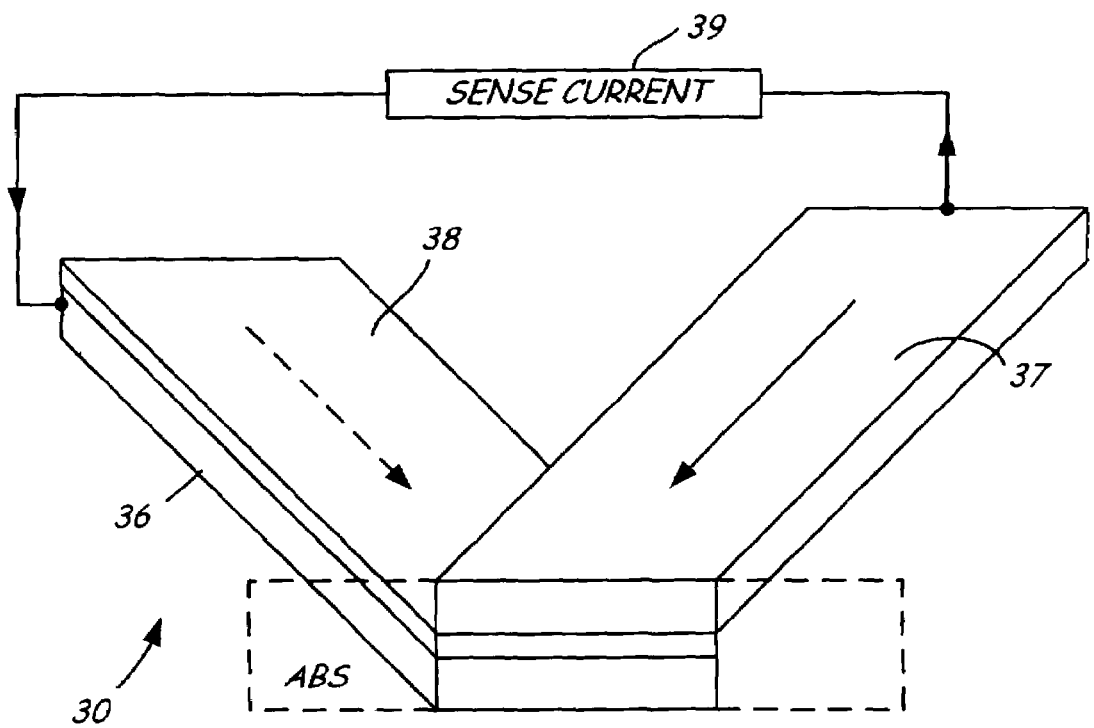
FIG. 2 shows an MR sensor according to a second embodiment of the present invention.

FIG. 2 shows an MR sensor 30 according to a second embodiment of the present invention. MR sensor 30 includes first elongated free layer 36, second elongated free layer 37, and spacer layer 38. Spacer layer 38 is positioned between first free layer 36 and second free layer, 37 and covers the entire surface of first free layer 36 that confronts second free layer 37. Spacer layer 38 can be either a tunnel barrier (to form a TMR sensor) or a conducting spacer (to form a current perpendicular-to-plane GMR sensor). First free layer 36 and second free layer 37 are situated at an angle with respect to each other. Also, each of first free layer 36 and second free layer 37 form an angle with respect to the air-bearing surface (ABS). The magnetization directions of free layers 26 and 27 are denoted by the arrows on each of the free layers.

First free layer 36 and second free layer 37 have shape anisotropy induced magnetization directions. That is, the easy axis of magnetization of first free layer 36 and second free layer 37 in a quiescent state points in a direction based on the crystal structure of the material. First free layer 36 is positioned at an angle with respect to second free layer 37 to form a v-shape such that the magnetization directions of the free layers are generally orthogonal with respect to each other. Magnetic alignment between first free layer 36 and second free layer 37 is modifiable by adjusting the shape of the free layers and by adjusting the angle between the free layers. These modifications can be performed as the particular specifications of MR sensor 30 and the magnetoresistive read/write head dictate. Because first free layer 36 and second free layer 37 use shape anisotropy to achieve orthogonal magnetization in the free layers, permanent magnet biasing is not required as in prior art designs. This allows for a decrease in sensor size, which results in an increase in track density. Furthermore, no antiferromagnetic pinning layer is used in MR sensor 30, as both magnetic layers in MR sensor 30 are free layers. Thus, the stack thickness is decreased, which results in a further increase in linear density in MR sensor 30 than in prior art designs. The lack of an antiferromagnetic pinning layer also improves the conduction of heat away from MR sensor 30 at the ABS, thus improving thermal reliability of MR sensor 30. Finally, both free layers respond to an external magnetic field, thus increasing the sensitivity of the read head compared to conventional current-in-plane spin valves or tunneling heads, in which only one layer is free to respond to an external magnetic field.

In operation, MR sensor 30 flies over the surface of a rotating magnetic disc as a portion of a magnetoresistive read/write head. As MR sensor 30 passes over the disc, flux having varying magnetic field directions is emanated from the disc, representing different states of data that are written to the disc. This is known as bit flux. As the ABS of MR sensor 30 confronts flux emanating from the disc, the angle of magnetization between first free layer 36 and second free layer 37 changes depending on the direction of the magnetic field emanating from the disc (that is, depending on the state of data at the ABS of MR sensor 30). When the angle of magnetization between the free layers changes, the resistance across the sensor also changes. Sense current 39 is applied between first free layer 36 and second free layer 37 to detect this change in resistance with the changing magnetic field at the ABS.

Figure 3A:
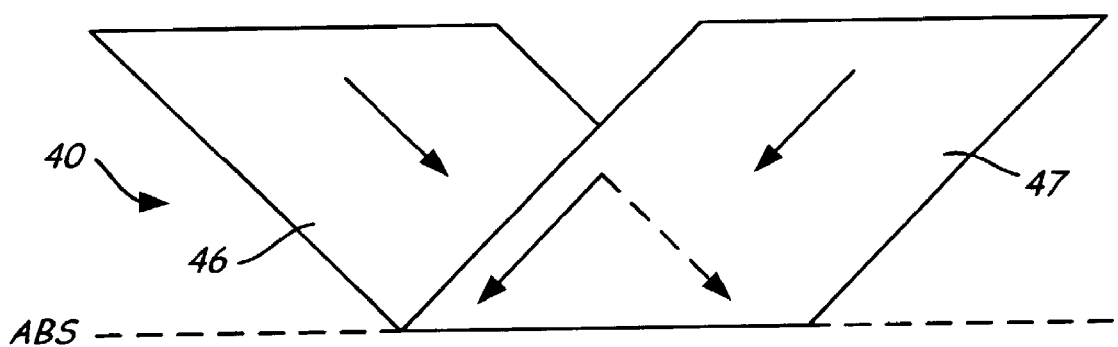
FIG. 3a is a top view of the M sensor of the present invention, showing the MR sensor in a quiescent state.
Figure 3B:
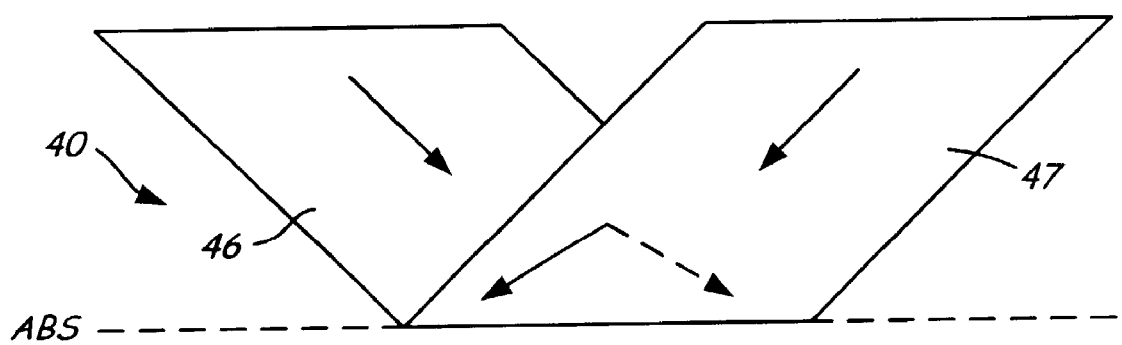
FIG. 3b is a top view of the MR sensor of the present invention, showing the MR sensor under the influence of a first state of data.
Figure 3C:
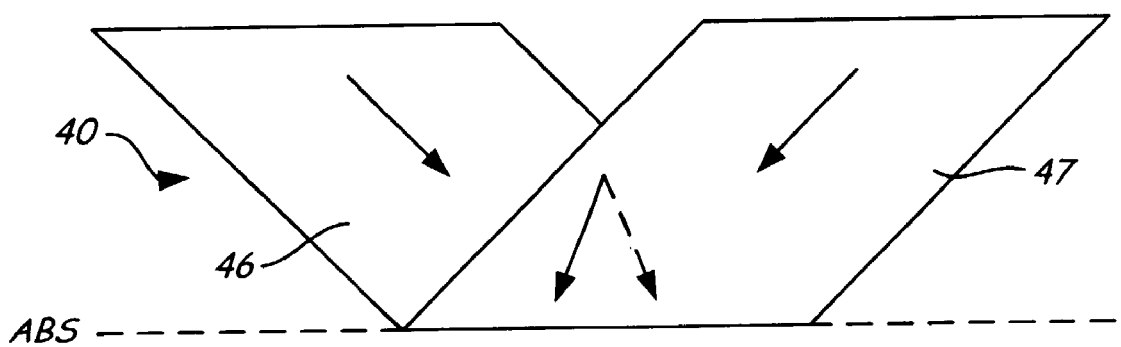
FIG. 3c is a top view of the MR sensor of the present invention, showing the MR sensor under the influence of a second state of data.

FIGS. 3a, 3b, and 3c show top views of an MR sensor 40 according to the present invention, provided to show the effect of varying data states (bit flux) on the magnetization direction of the first free layer 46 and second free layer 47. MR sensor 40 is representative of both embodiments of the present invention (FIGS. 2 and 3). The spacer layer has been omitted from FIGS. 3a, 3b, and 3c for clarity. FIG. 3a is a top view of MR sensor 40, showing MR sensor 40 in a quiescent state. That is, FIG. 3a shows MR sensor 40 when it is not under the influence of magnetic flux emanating from the rotating disc. As can be seen, the angle of magnetization between first free layer 46 and second free layer 47 at the ABS is equal to the angle between the free layers. FIG. 3b is a top view of M sensor 40, showing MR sensor 40 under the influence of a first state of data. This first state of data causes the angle of magnetization between first free layer 46 and second free layer 47 to increase at the ABS. When this occurs, the resistance across MR sensor 40 changes and is detected when a sense current is passed through M sensor 40 (as in FIGS. 1 and 2). FIG. 3c is a top view of MR sensor 40, showing MR sensor 40 under the influence of a second state of data. This second state of data causes the angle of magnetization between first free layer 46 and second free layer 47 to decrease at the ABS. As with the first state of data, the second state of data causes a change in resistance across MR sensor and is detected when a sense current is passed through MR sensor 40 (as in FIGS. 2 and 3).

Figure 4A:
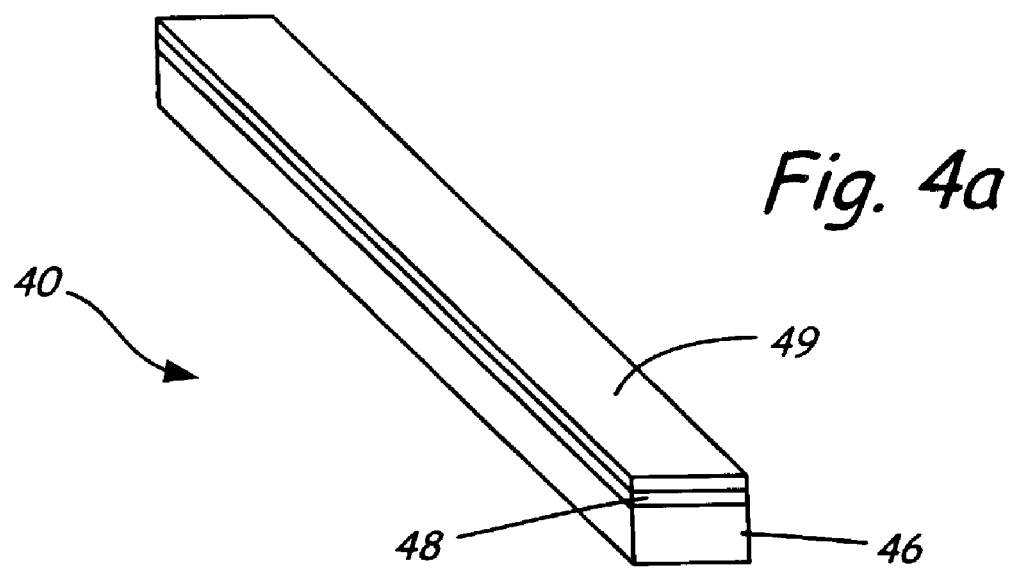
FIG. 4a shows a first step in fabricating an MR sensor according to the present invention.

FIGS. 4a-4d show the steps in fabricating MR sensor 40 according to the present invention. Again, MR sensor 40 is representative of the two embodiments shown in FIGS. 2 and 3, and the fabrication techniques described are applicable to both of these embodiments. FIG. 4a shows the first step, in which first free layer 46, spacer layer 48, and a protective free layer 49 are deposited and their shaped defined as shown in FIG. 5a using lithographic techniques. First free layer 46 and protective free layer 49 are formed of a ferromagnetic material such as NiFe or CoFe. Spacer layer 48 can be either a tunnel barrier (to form a TMR sensor) or a conducting spacer such as copper, gold, or silver (to form a current perpendicular-to-plane GMR sensor).

Figure 4B:
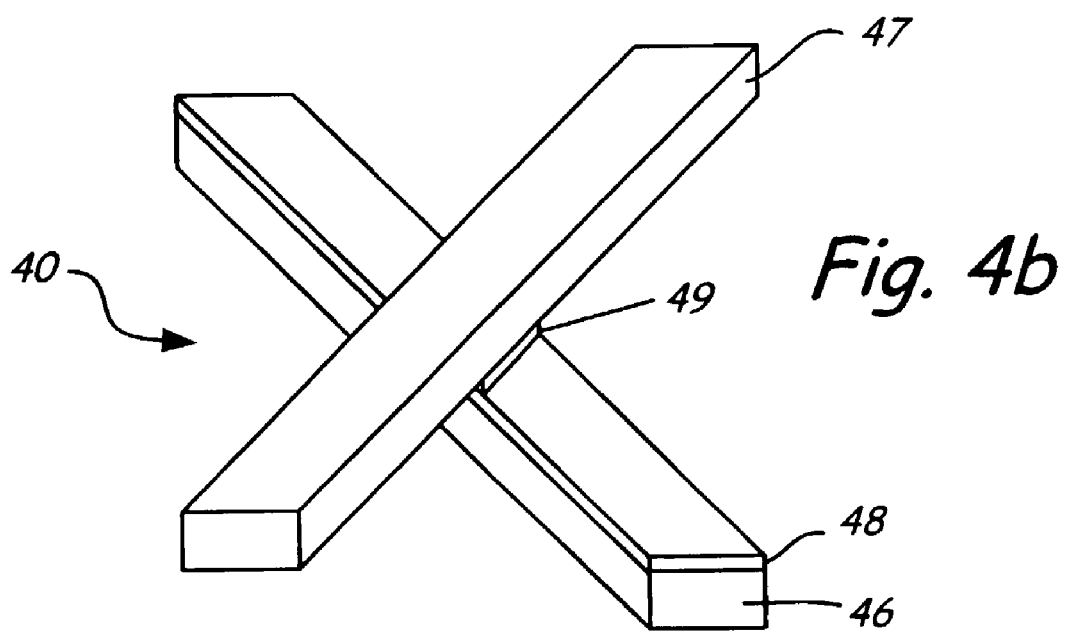
FIG. 4b shows a second step in fabricating an MR sensor according to the present invention.

FIG. 4b shows the second step of fabricating MR sensor 40, in which a second free layer 47 is deposited to its final thickness. The shape of second free layer 49 is then defined using lithographic techniques to form a general "x"-shape. The angle between first free layer 46 and second free layer 47 is variable based on the particular specifications of the MR sensor. First free layer 46 and second free layer 47 are preferably positioned such that the magnetization directions of the free layers are orthogonal with respect to each other in a quiescent state. As shown in FIG. 4b, MR sensor 40 can be shaped such that spacer layer 48 remains along the entire face of first free layer 46 that confronts second free layer 47 (as in the embodiment shown in FIG. 2). In this way, protective free layer 49 is shaped to cover only area between second free layer 47 and spacer layer 48. Alternatively, spacer layer 48 may also be shaped using lithographic techniques to match the shape of protective free layer 49, thereby producing the MR sensor embodiment shown in FIG. 1.

Figure 4C:
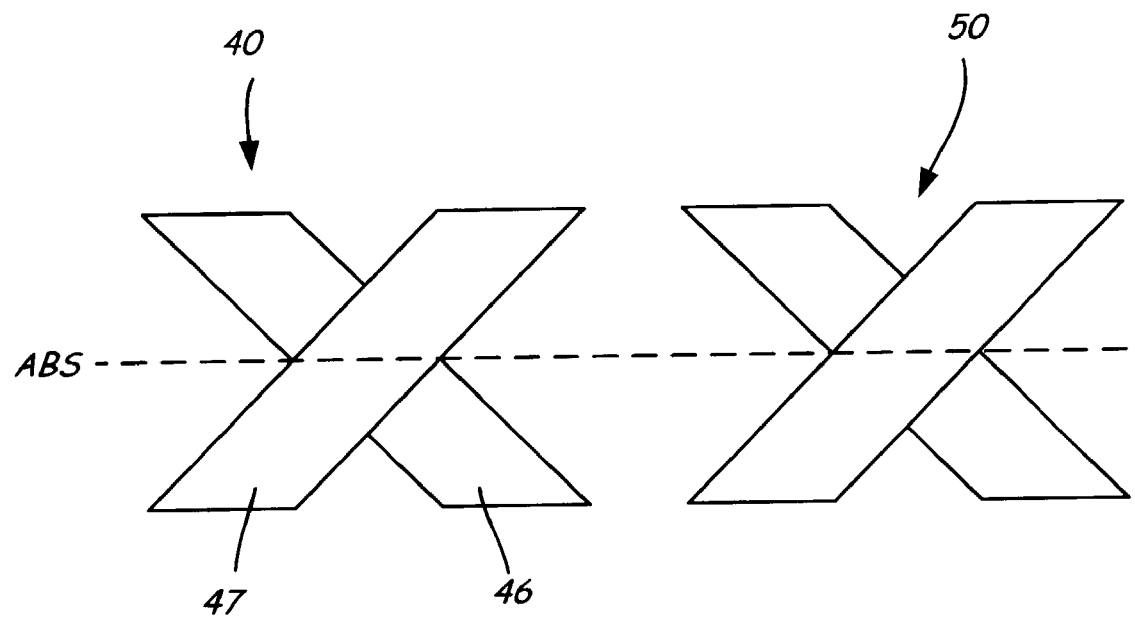
FIG. 4c shows a third step in fabricating an MR sensor according to the present invention.
Figure 4D:
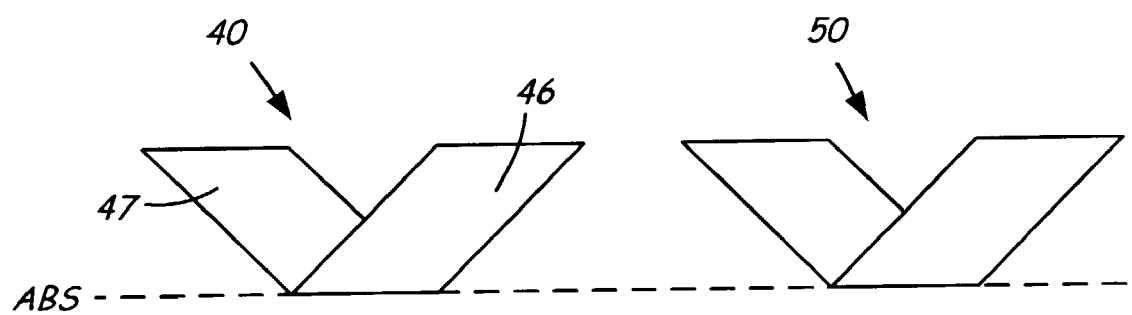
FIG. 4d shows a fourth step in fabricating an MR sensor according to the present invention.

FIG. 4c shows the third step in fabricating MR sensor 40 according to the present invention. For clarity, only first free layer 46 and second free layer 47 are shown. In order to lap MR sensor 40 to the desired height for use in a magnetoresistive read/write head, lap monitor 50 is provided. Lap monitor 50 has a shape substantially identical to MR sensor 40. To begin the lapping process, lap monitor 50 is placed on top of MR sensor 40. MR sensor 40 and lap monitor 50 are then simultaneously lapped until a resistance of a variable resistor located within lap monitor 50 is approximately equal to a resistance of a target resistor located within lap monitor 50. During the lapping process, a reference resistor located within lap monitor 50 is compared to both the variable and target resistors to prevent lapping failure. Typically, the reference, target, and variable resistors are formed from a ferromagnetic alloy. Thus, in the typical configuration, lap monitor 50 and MR sensor 40 are lapped until the height of the ferromagnetic metal alloy forming the variable resistor is approximately equal to the height of ferromagnetic metal alloy forming the target resistor while concurrently comparing these resistors to the resistance of the reference resistor to detect a lapping failure. Lap monitor 50 is formed using the same lithographic techniques as those used in the formation of MR sensor 40. Because of this, lap monitor 50 allows for accurate control of the lapping process. Furthermore, the use of lap monitor 50 compensates for possible misalignment between lithographic steps, such as the definition of first free layer 46 and second free layer 47 in FIGS. 4a and 4b. FIG. 4d shows the final step in fabricating MR sensor 40, showing MR sensor 40 after being lapped to form the air bearing surface.

In conventional magnetoresistive sensor designs, the desired shape anisotropy along the air-bearing surface is achieved by lapping the sensor to a desired stripe height. As the sensor width decreases, the requirements of stripe height lapping control become very stringent (that is, absolute values of variance in stripe height become smaller), and the desired stripe height may become difficult to achieve. MR sensor 40 of the present invention does not depend on an anisotropy induced by lapping, and thus is less sensitive to stripe height variance from the lapping process.

The present invention is a magnetoresistive sensor having two free layers with shape anisotropy induced magnetic alignment. The magnetoresistive sensor includes a first elongated ferromagnetic free layer having a first quiescent state magnetization direction. The magnetoresistive sensor also includes a second elongated free layer having second quiescent state magnetization direction and positioned such that the first quiescent state magnetization direction is angled generally orthogonal to the second quiescent state magnetization direction. Further, a portion of the second elongated ferromagnetic free layer overlaps a portion of the first elongated ferromagnetic free layer proximal to the air bearing surface to form a v-shape. Because the free layers use shape anisotropy to achieve orthogonal magnetization in the free layers, permanent magnet biasing is not required as in prior art designs. This allows for a decrease in sensor size, which results in an increase in track density. Furthermore, no antiferromagnetic pinning layer is used in the MR sensor of the present invention, as both magnetic layers are free layers. Thus, the stack thickness is decreased, which results in a further increase in linear density than in prior art designs. The lack of an antiferromagnetic pinning layer also improves the conduction of heat away from the ABS, thus improving thermal reliability of the MR sensor. Finally, both free layers respond to an external magnetic field, thus increasing the sensitivity of the read head compared to conventional current-in-plane spin valves or tunneling heads, in which only one layer is free to respond to an external magnetic field.

Although the present invention has been described with reference to preferred embodiments, workers skilled in the art will recognize that changes may be made in form and detail without departing from the spirit and scope of the invention. For example, as particular applications dictate, the angle between the free layers and the angle between the quiescent state magnetization directions of the free layers may be varied.

The invention claimed is:

1. A magnetoresistive sensor comprising:
    a first ferromagnetic free layer having an elongate dimension and a first quiescent state magnetization direction substantially parallel with the elongate dimension of the first ferromagnetic free layer;
    a second ferromagnetic free layer having an elongate dimension and a second quiescent state magnetization direction substantially parallel with the elongate dimension of the second ferromagnetic free layer and angled generally orthogonal to the first quiescent state magnetization direction; and
    a nonmagnetic spacer positioned between the first ferromagnetic free layer and the second ferromagnetic free layer.

2. The magnetoresistive sensor of claim 1, wherein the first quiescent state magnetization direction and the second quiescent state magnetization direction are generally orthogonal with respect to each other due to shape anisotropy.

3. The magnetoresistive sensor of claim 2, wherein the first magnetization direction and the second magnetization direction rotate about their respective quiescent states in response to an external magnetic field.

4. The magnetoresistive sensor of claim 1, wherein the nonmagnetic spacer is a tunnel barrier.

5. The magnetoresistive sensor of claim 4, wherein an external magnetic field produces a tunneling magnetoresistive (TMR) effect in the tunnel barrier.

6. The magnetoresistive sensor of claim 1, wherein the nonmagnetic spacer is a conducting spacer.

7. The magnetoresistive sensor of claim 6, wherein an external magnetic field produces a giant magnetoresistive (GMR) effect in the conducting spacer.

8. The magnetoresistive sensor of claim 1, wherein the nonmagnetic spacer completely covers a top planar surface of the first ferromagnetic free layer.

9. The magnetoresistive sensor of claim 1, wherein the first ferromagnetic free layer and the second ferromagnetic free layer are each oriented at equal angles relative to a medium confronting surface of the magnetoresistive sensor.

10. A read sensor comprising:
a first elongated free layer;
a second elongated free layer positioned such that the first elongated free layer and the second elongated free layer are oriented at an angle relative to each other, and such that a portion of the second elongated ferromagnetic free layer overlaps a portion of the first elongated ferromagnetic free layer to form a v-shape; and
a nonmagnetic spacer positioned between the first elongated free layer and the second elongated free layer.

11. The read sensor of claim 10, wherein the first elongated ferromagnetic free layer and the second elongated ferromagnetic free layer are oriented at equal angles relative to a medium confronting surface of the read sensor.

12. The read sensor of claim 10, wherein the nonmagnetic spacer means is a tunnel barrier.

13. The read sensor of claim 12, wherein flux emanated from a magnetic medium produces a tunneling magnetoresistive (TMR) effect in the tunnel barrier.

14. The read sensor of claim 10, wherein the nonmagnetic spacer means is a conducting spacer.

15. The read sensor of claim 14, wherein flux emanated from a magnetic medium produces a giant magnetoresistive (GMR) effect in the conducting spacer.

16. A sensor consisting of:
a first ferromagnetic free layer;
a second ferromagnetic free layer positioned such that a quiescent state magnetization of the first ferromagnetic free layer is aligned generally orthogonal to a quiescent state magnetization of the second ferromagnetic free layer due to shape anisotropy; and
a nonmagnetic spacer layer positioned between the first ferromagnetic free layer and the second ferromagnetic free layer.

17. The sensor of claim 16, wherein the magnetization of the first ferromagnetic free layer and the magnetization of the second ferromagnetic free layer rotate about their respective quiescent bias states in response to external flux.

18. The sensor of claim 17, wherein rotation of the magnetization of the free layers produces a giant magnetoresistive effect.

19. The sensor of claim 16, wherein the nonmagnetic spacer layer is a tunnel barrier.

20. The sensor of claim 19, wherein external flux produces a tunneling magnetoresistive (TMR) effect in the tunnel barrier.

21. The sensor of claim 16, wherein the nonmagnetic spacer means is a conducting spacer.

22. The sensor of claim 21, wherein external flux produces a giant magnetoresistive (GMR) effect in the conducting spacer.

23. A magnetoresistive element comprising:
a first free layer having a shape anisotropy induced first magnetization direction;
a second free layer overlapping a portion of the first free layer and having a shape anisotropy induced second magnetization direction, the second free layer positioned at a non-zero angle relative to the first free layer; and
a spacer layer positioned between the overlapping portions of the first free layer and the second free layer.

24. The magnetoresistive element of claim 23, further comprising means connected to the first free layer and the second free layer for deriving a magnetoresistive signal.

25. The magnetoresistive element of claim 23, wherein the first magnetization direction and the second magnetization direction are generally orthogonal with respect to each other when the magnetoresistive element is in a quiescent state.

26. The magnetoresistive element of claim 23, wherein the angle between the first magnetization direction and the second magnetization direction changes in response to an external magnetic field.

27. The magnetoresistive element of claim 23, wherein resistance between the first free layer and the second free layer changes in response to an external magnetic field.

28. A method of forming a magnetoresistive sensor, the method comprising:
forming a first elongated ferromagnetic free layer having a first quiescent state magnetization direction;
forming a nonmagnetic spacer layer over the first ferromagnetic free layer;
forming a thin ferromagnetic protective layer over the nonmagnetic spacer layer;
etching the thin ferromagnetic protective layer to expose a portion of the nonmagnetic spacer layer; and
forming a second elongated ferromagnetic free layer having a second quiescent state magnetization direction over the thin ferromagnetic protective layer at a non-zero angle relative to the first elongated ferromagnetic free layer such that the first quiescent state magnetization direction is generally orthogonal to the second quiescent state magnetization direction and such that the combination of the first elongated ferromagnetic free layer, the nonmagnetic spacer layer, the thin ferromagnetic protective layer, and the second elongated ferromagnetic free layer forms the magnetoresistive sensor.

29. The method of claim 28, further comprising:
providing a lap monitor which corresponds to a shape of the magnetoresistive sensor; and lapping the lap monitor and the magnetoresistive sensor simultaneously.

30. The method of claim 29, wherein the lap monitor includes a variable resistor and a target resistor such that the lap monitor and the magnetoresistive sensor are lapped until a resistance of the variable resistor equals a resistance of the target resistor.

* * * * *